US012765288B2

(12) United States Patent
Deguchi

(10) Patent No.: US 12,765,288 B2
(45) Date of Patent: Oct. 13, 2026

(54) LIQUID CHEMICAL PROCESSING DEVICE

(71) Applicant: DAIKIN FINETECH, LTD., Yamatokoriyama (JP)

(72) Inventor: Yasunori Deguchi, Yamatokoriyama (JP)

(73) Assignee: DAIKIN FINETECH, LTD., Yamatokoriyama (JP)

( * ) Notice: Subject to any disclaimer, the term of this patent is extended or adjusted under 35 U.S.C. 154(b) by 471 days.

(21) Appl. No.: 17/758,667

(22) PCT Filed: Jan. 17, 2020

(86) PCT No.: PCT/JP2020/001560

§ 371 (c)(1),
(2) Date: Jul. 12, 2022

(87) PCT Pub. No.: WO2021/144982

PCT Pub. Date: Jul. 22, 2021

(65) Prior Publication Data

US 2023/0033493 A1 Feb. 2, 2023

(51) Int. Cl.
*H10P 50/00* (2026.01)
*B08B 3/12* (2006.01)
(Continued)

(52) U.S. Cl.
CPC ................ *H10P 50/00* (2026.01); *B08B 3/12* (2013.01); *H10P 72/0426* (2026.01); *H10P 72/0606* (2026.01); *H10P 72/7602* (2026.01)

(58) Field of Classification Search
CPC ............. H01L 21/306; H01L 21/67086; H01L 21/67259; H01L 21/68707
See application file for complete search history.

(56) References Cited

U.S. PATENT DOCUMENTS 2,299,618 A * 10/1942 Finston .............. B65G 49/0463 134/67
3,193,121 A * 7/1965 Kumpf ............... B65G 49/0463 198/346.3

(Continued)

FOREIGN PATENT DOCUMENTS

JP H03-246940 11/1991
JP 2005-079460 3/2005

(Continued)

OTHER PUBLICATIONS

International Search Report of PCT/JP2020/001560, Mar. 3, 2020, 5 pages including English translation.

(Continued)

*Primary Examiner* — Keath T Chen
*Assistant Examiner* — Margaret Klunk
(74) *Attorney, Agent, or Firm* — HSML P.C.

(57) ABSTRACT

A liquid chemical processing device that reduces variation in resist removal for each substrate includes: a processing tank (10*a*) in which resist removal processing is performed by immersing substrates (4) in a chemical (6); a plurality of holders (22) configured to hold the substrates (4) in a vertical posture; vertical drivers (20) configured to individually and vertically drive the holders (22); and a chuck (55) configured to disengageably chuck the substrates (4), wherein the vertical drivers (20) are configured to individually and vertically move the holders (22) between an immersed position where the substrates (4) are immersed in the chemical (6) and a non-immersed position where the substrates (4) are lifted up from the chemical (6), and the substrates (4) held by the holders (22) are subjected to the resist removal processing in a single wafer manner.

14 Claims, 12 Drawing Sheets

(51) Int. Cl.
*H10P 72/00* (2026.01)
*H10P 72/76* (2026.01)

(56) References Cited

U.S. PATENT DOCUMENTS 3,301,418 A * 1/1967 Davis ................. B65G 49/0463 198/341.02
3,987,816 A * 10/1976 Lange .................... C25D 17/02 137/574
4,135,530 A * 1/1979 Cheney ..................... B08B 3/04 134/91
4,924,890 A * 5/1990 Giles ................. H01L 21/67028 134/76
5,873,381 A * 2/1999 Han .................. H01L 21/67057 134/182
6,001,216 A * 12/1999 Lee ..................... H10P 72/0422 134/10
6,199,563 B1 * 3/2001 Uehara ............... H01L 21/2007 211/41.18
6,203,659 B1 * 3/2001 Shen ................. H01L 21/67086 216/85
6,235,147 B1 * 5/2001 Lee ..................... H01L 21/6708 156/345.23
6,732,749 B2 * 5/2004 Myland ................... B08B 3/102 134/25.4
6,875,289 B2 4/2005 Christenson et al.
2002/0139390 A1 * 10/2002 Okano ...................... B08B 3/10 134/184
2002/0153098 A1 * 10/2002 Kuroda ..................... B08B 3/04 156/345.31
2004/0050405 A1 * 3/2004 Christenson ........ H10P 72/0416 134/32
2008/0251465 A1 * 10/2008 Ralph ................... C02F 1/5281 210/208
2008/0271749 A1 * 11/2008 Freer ................. H01L 21/02057 134/57 R
2013/0167876 A1 7/2013 Takeaki et al.
2015/0270147 A1 * 9/2015 Kobayashi ........ H01L 21/68721 134/76
2015/0357213 A1 * 12/2015 Yokoyama ........ H01L 21/67742 134/32
2020/0168483 A1 * 5/2020 Doong .............. H01L 21/67057
2022/0359238 A1 * 11/2022 Cheng ...................... B05D 1/18

FOREIGN PATENT DOCUMENTS

JP 2005-311023 11/2005
JP 2013-138051 7/2013

OTHER PUBLICATIONS

International Preliminary Report on Patentability of PCT/JP2020/001560, Jul. 28, 2022, 6 pages.
The extended European search report issued for European Patent Application No. 20913532.6, Jun. 21, 2023, 7 pages.

* cited by examiner

LIQUID CHEMICAL PROCESSING DEVICE

TECHNICAL FIELD

The present invention relates to a liquid chemical processing device.

BACKGROUND ART

Conventionally, there are liquid chemical processing devices that immerse substrates in a stripping solution so as to strip off resists or metal films formed on the substrates.

Patent Document 1 discloses a liquid chemical processing device in which a holder horizontally holds substrates and a nozzle disposed near a side surface of the holder ejects a stripping solution to an upper side and a lower side of the substrates to prevent a stripped resist or a stripped metal film from readhering to the substrates.

PRIOR ART DOCUMENT

Patent Document

Patent Document 1: JP 2005-311023 A

SUMMARY OF THE INVENTION

Problems to be Solved by the Invention

In Patent Document 1, stripping processing is performed by a batch method in which a group of substrates is immersed in a stripping solution in a horizontal posture. Processing is repeatedly performed in which the group of substrates immersed in the stripping solution is lifted up, one substrate is taken out from the group of substrates and replaced with another substrate in an empty portion, and then the group of substrates is immersed. In the stripping processing performed by the batch method, each of the substrates is immersed and lifted up individually, and hence it is difficult to manage immersion temperature and immersion time for the individual substrates. Accordingly, variation occurs in resist removal for each substrate, which affects quality in a subsequent step.

It is therefore an object of the present invention to provide a liquid chemical processing device that reduces variation in resist removal for each substrate.

Means for Solving the Problems

In order to solve the above problems, a liquid chemical processing device according to one aspect of the present invention includes:

- a processing tank in which resist removal processing is performed by immersing substrates in a chemical;
- a plurality of holders configured to hold the substrates in a vertical posture;
- vertical drivers configured to individually and vertically drive the holders; and
- a chuck configured to disengageably chuck the substrates,
- wherein the vertical drivers are configured to individually and vertically move the holders between an immersed position where the substrates are immersed in the chemical and a non-immersed position where the substrates are lifted up from the chemical, and the substrates held by the holders are subjected to the resist removal processing in a single wafer manner.

In this specification, the term "resist removal processing" includes not only processing of removing a resist alone but also processing of removing a resist and a metal film provided on the resist together, so-called lift-off processing.

Effects of the Invention

According to the present invention, each of the substrates held by the holders is subjected to the resist removal processing in a single wafer manner by being individually and vertically moved between the immersed position and the non-immersed position. Accordingly, it is possible to reduce variation in resist removal for each substrate.

MODES FOR CARRYING OUT THE INVENTION

Hereinafter, embodiments of a liquid chemical processing device 1 according to the present invention will be described with reference to the drawings.

First Embodiment

Figure 1:
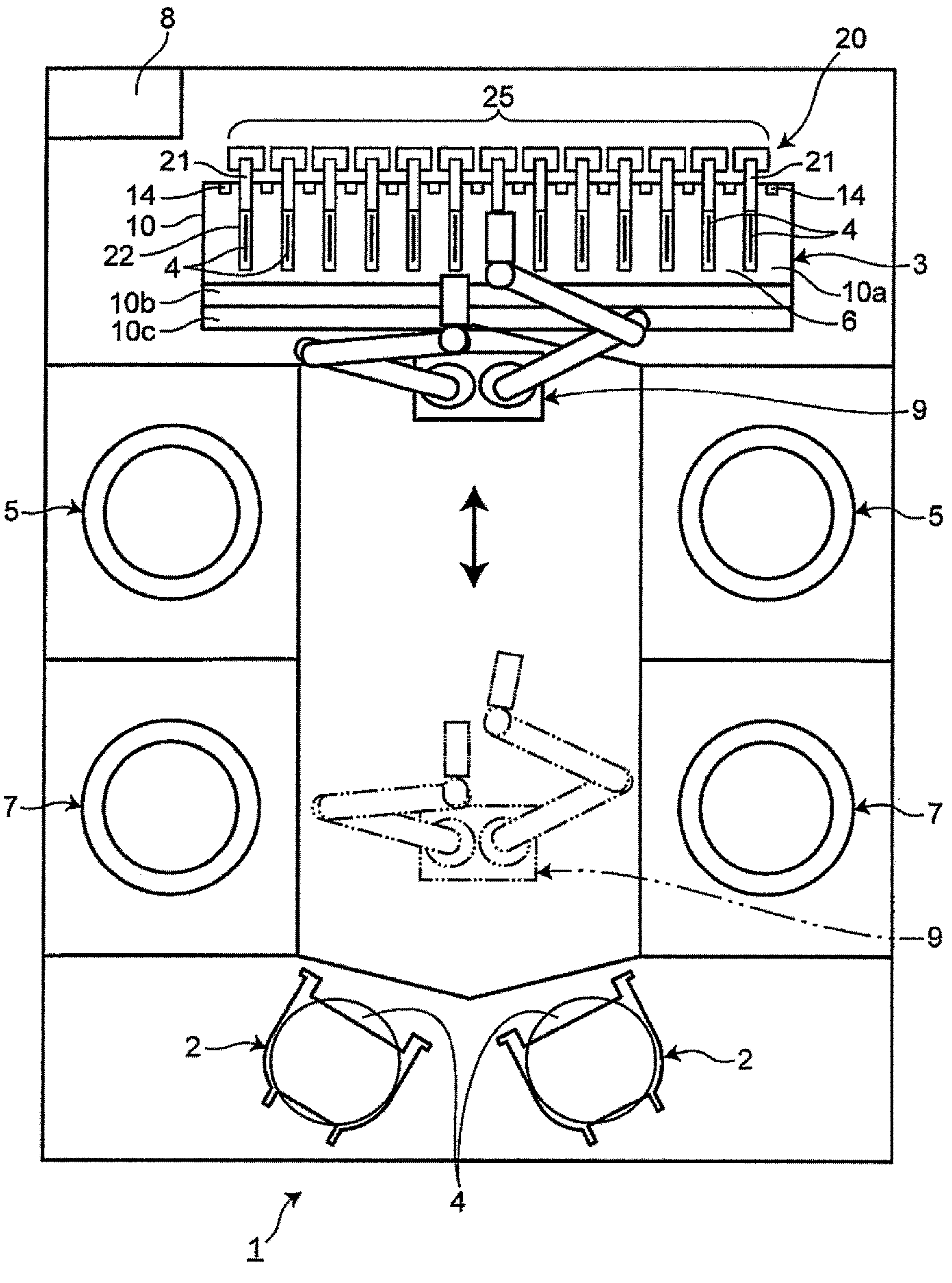
FIG. 1 is a plan view illustrating a liquid chemical processing device according to a first embodiment.
Figure 2:
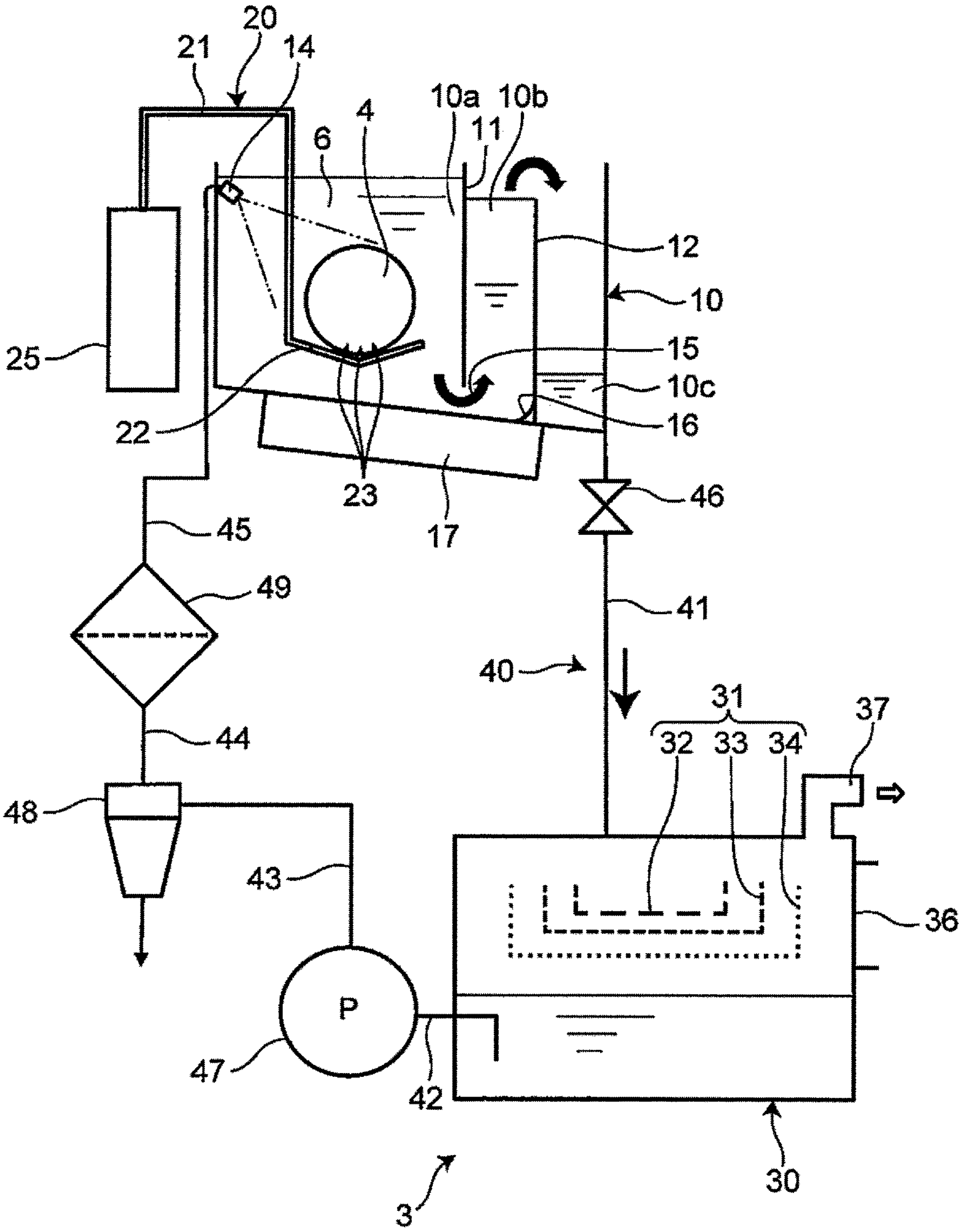
FIG. 2 is a schematic diagram illustrating a swelling processing system in the liquid chemical processing device illustrated in FIG. 1.
Figure 3:
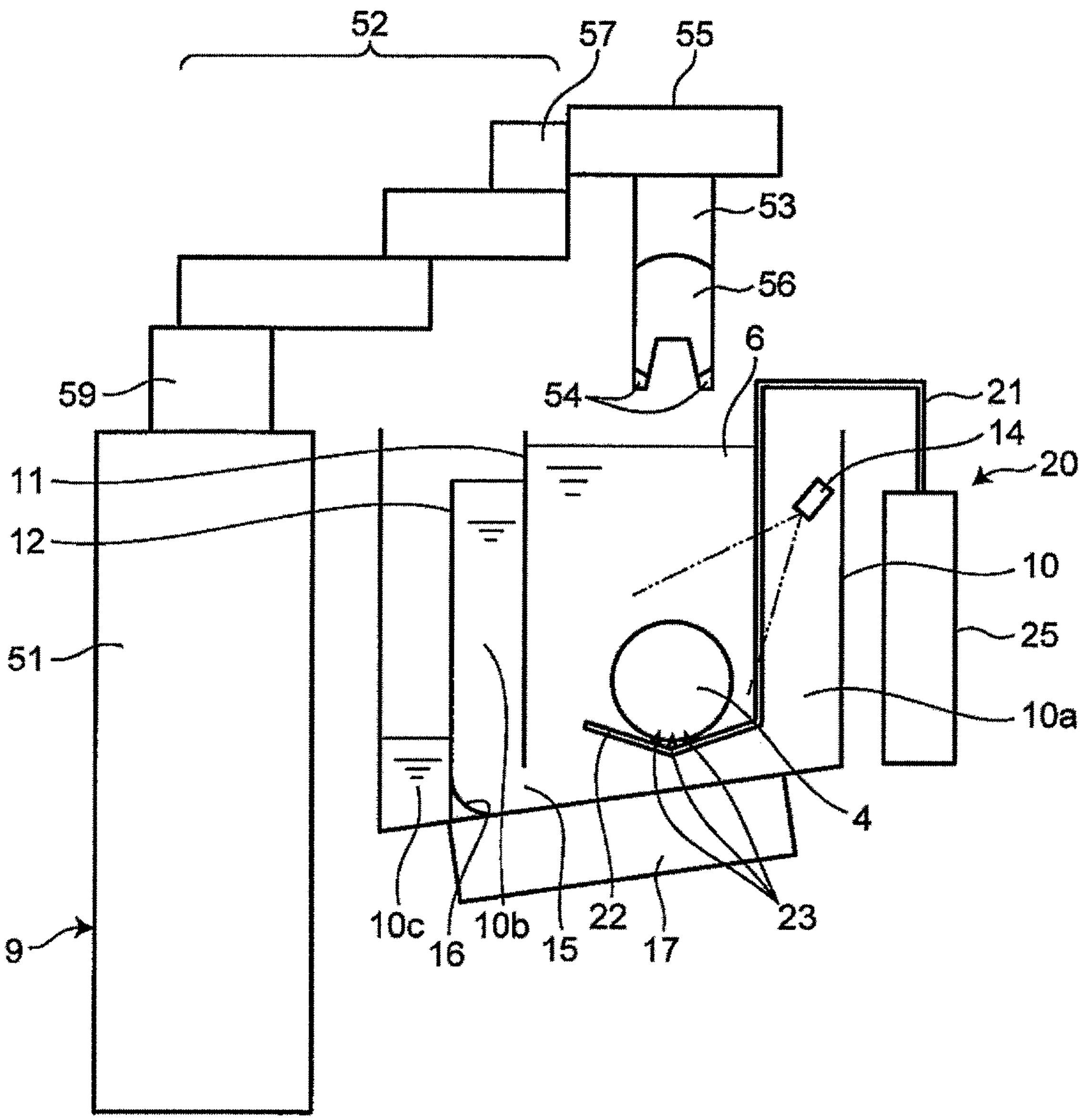
FIG. 3 is a schematic diagram illustrating resist removal processing in the liquid chemical processing device illustrated in FIG. 1.
Figure 4:
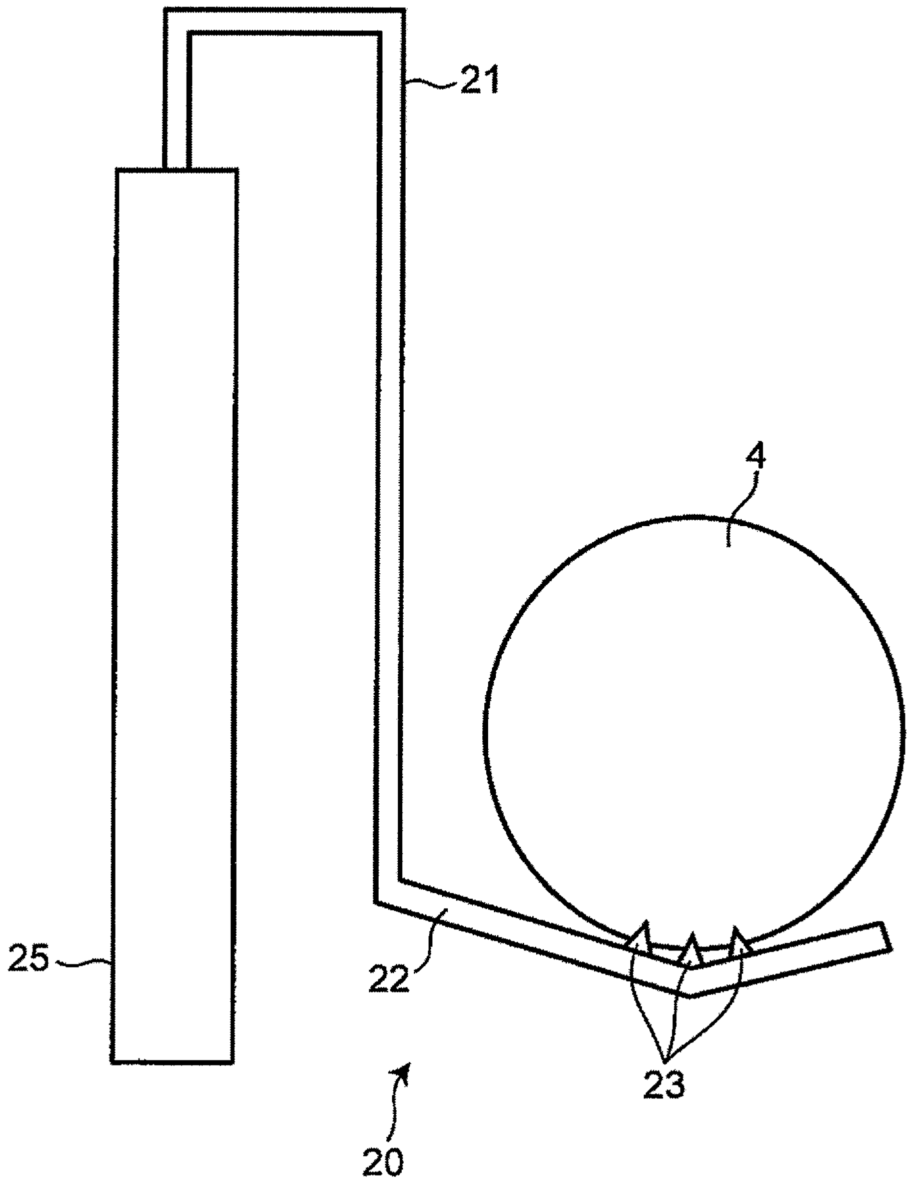
FIG. 4 is a schematic front view illustrating a vertical driver in the liquid chemical processing device illustrated in FIG. 1.
Figure 5:
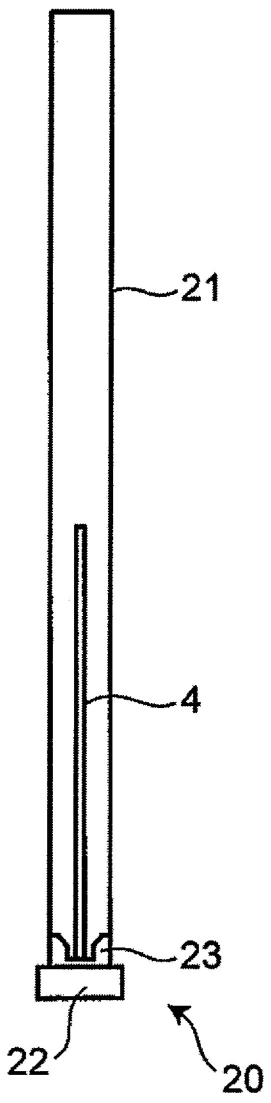
FIG. 5 is a schematic side view of the vertical driver illustrated in FIG. 4.
Figure 6:
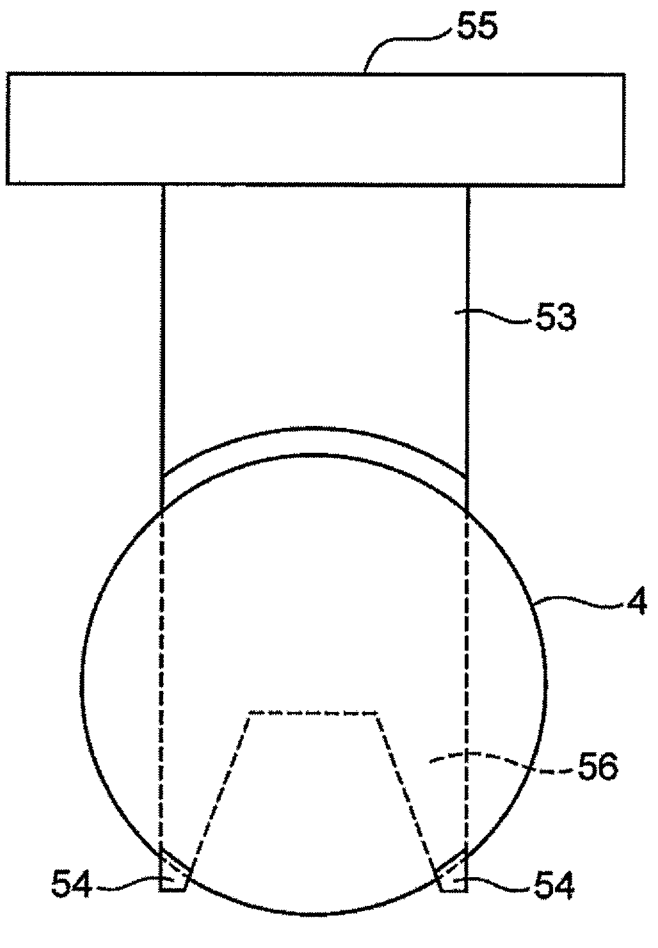
FIG. 6 is a schematic front view illustrating a chuck in the liquid chemical processing device illustrated in FIG. 1.
Figure 7:
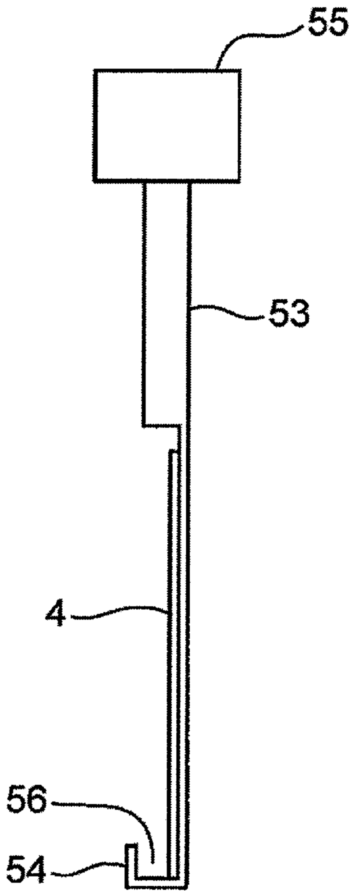
FIG. 7 is a schematic side view of the chuck illustrated in FIG. 6.
Figure 8:
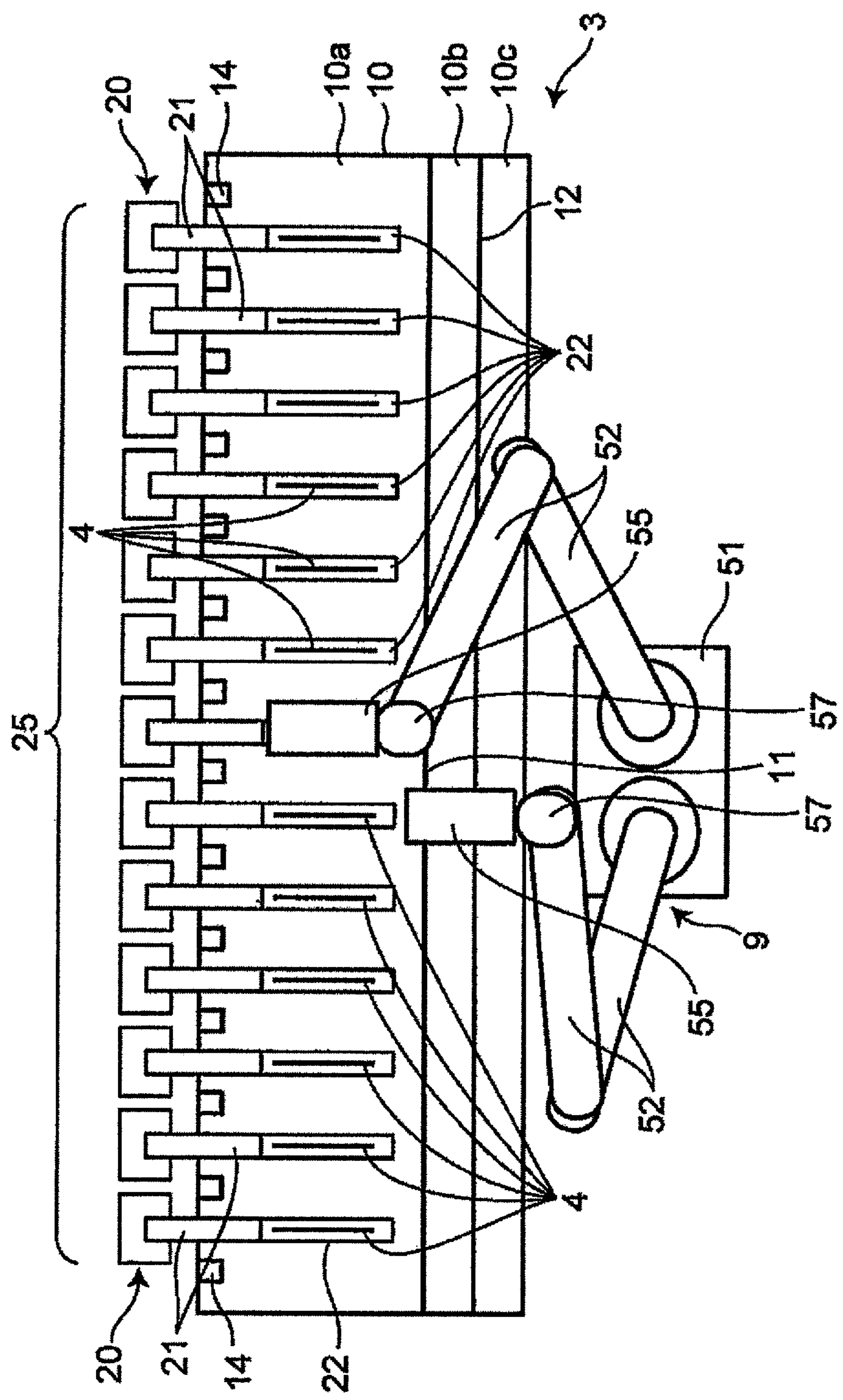
FIG. 8 is a plan view illustrating a swelling processing tank in the liquid chemical processing device illustrated in FIG. 1.

A liquid chemical processing device 1 according to a first embodiment will be described with reference to FIGS. 1 to 6. FIG. 1 is a plan view illustrating the liquid chemical processing device 1 according to the first embodiment. FIG. 2 is a schematic diagram illustrating a swelling processing system 3 in the liquid chemical processing device 1 illustrated in FIG. 1. FIG. 3 is a schematic diagram illustrating resist removal processing in the liquid chemical processing device 1 illustrated in FIG. 1. FIG. 4 is a schematic front view illustrating a vertical driver 20 in the liquid chemical processing device 1 illustrated in FIG. 1. FIG. 5 is a schematic side view of the vertical driver 20 illustrated in FIG. 4. FIG. 6 is a schematic front view illustrating a chuck 55 in the liquid chemical processing device 1 illustrated in FIG. 1. FIG. 7 is a schematic side view of the chuck 55 illustrated in FIG. 6. FIG. 8 is a plan view illustrating a swelling processing tank 10 in the liquid chemical processing device 1 illustrated in FIG. 1.

As illustrated in FIG. 1, the liquid chemical processing device 1 includes the swelling processing tank 10, cleaning processing tanks 5, 5, drying processing tanks 7, 7, a controller 8, and an articulated robot 9. The articulated robot 9 includes a dry-dedicated robot and a wet-dedicated robot. In the liquid chemical processing device 1 illustrated in FIG. 1, one cleaning processing tank 5 and one drying processing tank 7 are disposed on one side with respect to the swelling processing tank 10, and another cleaning processing tank 5 and another drying processing tank 7 are disposed on the other side with respect to the swelling processing tank 10. In addition, carriers 2, 2 are disposed on an opposite side with respect to the swelling processing tank 10, the cleaning processing tanks 5 and the drying processing tanks 7 being interposed therebetween. The swelling processing tank 10, the cleaning processing tanks 5, 5, the drying processing tanks 7, 7, and the carriers 2, 2 are arranged to surround the articulated robot 9 in a plan view. An object of the liquid chemical processing device 1 is to make circuit patterns or the like on flat substrates 4 (for example, wafers) by removing photoresists and metal films formed thereon, except for the circuit patterns, from the substrates 4 (hereinafter, photoresists and metal films are collectively referred to as "coating material").

As illustrated in FIG. 2, the swelling processing system 3 includes the swelling processing tank 10, a plurality of substrate up-and-down actuators 20, and a sludge recovery tank 30. As will be described later, in the swelling processing system 3, the plurality of substrate up-and-down actuators 20 disposed in the swelling processing tank 10 are configured to perform resist removal processing on a plurality of substrates 4 in a single wafer manner.

The swelling processing tank 10 stores a stripping solution (that is, chemical (liquid chemical)) 6 and includes a processing tank 10*a*, a storage tank 10*b*, and a discharge tank 10*c*. The swelling processing tank 10 is configured such that the stripping solution (chemical) 6 flows from the processing tank 10*a* to the storage tank 10*b*, and further flows from the storage tank 10*b* to the discharge tank 10*c*. That is, the stripping solution 6 flows in one direction in the swelling processing tank 10.

As illustrated in FIGS. 1 and 8, in the processing tank 10*a*, the plurality of substrate up-and-down actuators 20 are arranged in a row spaced apart from each other along a longitudinal direction (that is, lateral direction) of the processing tank 10*a*. Nozzles 14 are each disposed between two adjacent substrate up-and-down actuators 20. Also, two nozzles 14 are each disposed adjacent and outwardly to two substrate up-and-down actuators 20 at one end and another end. The controller 8 individually controls each of the substrate up-and-down actuators 20.

The controller 8 includes a central processing unit (CPU), and controls various operations and processes in the liquid chemical processing device 1 using various memories such as read only memories (ROMs) and random access memories (RAMs), and various input devices and output devices. Details of the substrate up-and-down actuator 20 and the articulated robot 9 will be described later.

In the processing tank 10*a*, the substrate up-and-down actuator 20 is configured to move the substrate 4 in a vertical direction between an immersed position where the substrate 4 is immersed in the stripping solution 6 and a non-immersed position where the substrate 4 is lifted up from the stripping solution 6. By immersing the substrate 4 in the stripping solution (chemical) 6 stored in the processing tank 10*a*, a photoresist formed on the substrate 4 swells, and the coating material is stripped off from the substrate 4.

As illustrated in FIG. 2, a bottom of the swelling processing tank 10 is inclined downward with respect to a flow direction of the stripping solution (chemical) 6 from the processing tank 10*a* to the discharge tank 10*c*. An ultrasonic generator 17 is disposed at the bottom of the swelling processing tank 10 (specifically, a bottom of the processing tank 10*a* and a bottom of the storage tank 10*b*). With such a configuration including the ultrasonic generator 17, stripping of the coating material from the substrates 4 is promoted, and the coating material stripped off from the substrates 4 is pulverized, so that sludge generated by the pulverization easily flows downstream.

The nozzles 14 are disposed at an upper portion and upstream side of the processing tank 10*a*. The nozzles 14 are configured to eject the stripping solution (that is, chemical) 6 downward and obliquely toward the center of the substrate 4 to generate a downflow. With such a configuration, the stripped coating material is prevented from readhering to the substrates 4, so that the generated sludge is easily recovered. The nozzles 14 are, for example, full cone nozzles. For example, flow rates of the stripping solution (that is, chemical) 6 ejected from the nozzles 14 are 1 to 2 liters/minute, and a flow velocity of the stripping solution (that is, chemical) 6 is 1 to 1.8 m/second.

The processing tank 10*a* and the storage tank 10*b* are separated from each other by a communication side-wall 11. The processing tank 10*a* communicates with the storage tank 10*b* adjacent to the processing tank 10*a* through a communication port 15 provided in a bottom of the communication side-wall 11. With such a configuration, the stripping solution (chemical) 6 in the processing tank 10*a* flows into the storage tank 10*b* as a downflow. Accordingly, it is possible to prevent the stripped coating material from readhering to the substrates 4. The storage tank 10*b* and the discharge tank 10*c* adjacent to the storage tank 10*b* are also separated from each other by an overflow side-wall 12.

In the storage tank 10*b*, a stagnation prevention portion 16 is formed at a corner, on a bottom, on an opposite side of the communication port 15 (that is, a side of the overflow side-wall 12). With such a configuration, it is possible to prevent sludge from accumulating at the corner where the bottom of the storage tank 10*b* and the overflow side-wall 12 intersect with each other. The stagnation prevention portion 16 has a round shape or a chamfered shape.

A height of the overflow side-wall 12 is set to be lower than a height of the communication side-wall 11. As a result, the stripping solution (that is, chemical) 6 in the storage tank 10*b* that flows over the overflow side-wall 12 flows into the discharge tank 10*c*.

A circulation path 40 through which the stripping solution (that is, chemical) 6 flows and circulates in the swelling processing system 3 will be described with reference to FIG. 2. A pipe 41 is connected to a bottom of the discharge tank 10*c*. A valve 46 provided in a middle of the pipe 41 controls a flow of the stripping solution (that is, chemical) 6 through the circulation path 40.

The pipe 41 is connected to an upper portion of the sludge recovery tank 30. The sludge recovery tank 30 includes a mesh filter 31, which is made of stainless steel, in an upper portion thereof. The mesh filter 31 is disposed just below a connection portion of the pipe 41 so as to receive the stripping solution (that is, chemical) 6 that flows through the pipe 41. The mesh filter 31 includes, for example, a coarse mesh basket 32 coarser than 20 mesh (that is, mesh opening of 0.77 to 0.98 mm), an intermediate mesh basket 33 that is substantially 50 mesh (that is, mesh opening of 0.28 to 0.33 mm), and a fine mesh basket 34 that is substantially 100 mesh (that is, mesh opening of 0.15 mm). The mesh filter 31 is configured to be attached to and detached from the sludge recovery tank 30 through a filter take-out portion 36. An exhaust unit 37 opened to an atmosphere is provided in the upper portion of the sludge recovery tank 30.

A circulation pump 47 is connected to the downstream side of the sludge recovery tank 30 via a pipe 42. A liquid cyclone 48 is connected to the downstream side of the circulation pump 47 via a pipe 43. A chemical filter 49 is connected to the downstream side of the liquid cyclone 48 via a pipe 44. The nozzles 14 are connected to the downstream side of the chemical filter 49 via a pipe 45. Therefore, in the swelling processing system 3, the stripping solution (chemical) 6 circulates between the discharge tank 10*c* and the nozzles 14 disposed in the processing tank 10*a* through the circulation path 40. By circulating the stripping solution (chemical) 6, an organic solvent and metal contained in the used stripping solution (chemical) 6 can be reused, so that running costs of the liquid chemical processing device 1 can be reduced.

The circulation path 40 of the swelling processing system 3 is provided with filtering systems 31, 48, and 49 in which recovery target size of the sludge contained in the stripping solution (chemical) 6 is reduced stepwise (for example, in three stages). That is, the mesh filter 31 serves as first-stage filtering to filter sludge of 100 μm or more. The liquid cyclone 48 serves as second-stage filtering to filter sludge of 2 μm to 100 μm by performing solid-liquid separation by centrifugal force. The chemical filter 49 serves as third-stage filtering to filter sludge of 0.2 μm to 2 μm. With such a configuration, it is possible to reduce replacement frequency of expensive filter elements, suppress downtime of the liquid chemical processing device 1, and increase production efficiency.

The substrate up-and-down actuator 20 serves as a vertical driver, and includes a vertical movement arm 21, a holder 22, substrate receivers 23, and a vertical movement actuator 25. The holder 22 is provided on a distal end of the vertical movement arm 21, and the vertical movement actuator 25 is provided on a proximal end of the vertical movement arm 21. The vertical movement actuator 25 is, for example, driven by an electric motor or a fluid cylinder. The controller 8 controls an operation of the vertical movement actuator 25 along the vertical direction.

In the processing tank 10*a* of the swelling processing tank 10, the holder 22 holds the substrate 4 in a vertical posture. As illustrated in FIG. 4, the holder 22 is bent in a V shape in a front view. A plurality of (at least three) substrate receivers 23 are provided on an upper surface of the holder 22. As illustrated in FIG. 5, the substrate receiver 23 has a groove having a Y shape to support and hold a lower peripheral edge of the substrate 4.

When the controller 8 controls the vertical movement actuator 25 so that the vertical movement actuator 25 drives the vertical movement arm 21 along the vertical direction, thereby moving the holder 22 vertically. The substrate 4 held in a vertical posture by the holder 22 moves between the non-immersed position where the substrate 4 is lifted up from the stripping solution (that is, chemical) 6 and the immersed position where the substrate 4 is immersed in the stripping solution (that is, chemical) 6. The controller 8 controls time during which the substrate up-and-down actuator 20 keeps the substrate 4 at the immersed position, that is, swelling processing time.

As illustrated in FIG. 3, the articulated robot 9 includes a base 51, an articulated arm 52, the chuck 55, and a turning unit 57. A proximal end of the articulated arm 52 is fixed to a support column 59 extending perpendicularly from the base 51. A distal end of the articulated arm 52 is connected to the chuck 55 via the turning unit 57. The articulated arm 52 includes a plurality of arm members, and the arm member on the proximal end is fixed to an upper end of the support column 59. The support column 59 is configured to rotate about a support shaft of the support column 59 and reciprocate perpendicularly by a drive system and a driving force transmission mechanism, not illustrated, provided inside the base 51. Therefore, the arm on the proximal end is rotatable in a horizontal plane by a rotating action of the support column 59.

An arm member is attached to an arm member on its proximal side rotatably in a horizontal plane by a connecting shaft. The chuck 55 is turnably attached to the arm member on the distal end by the turning unit 57. Therefore, the chuck 55 is turnable about a turning shaft of the turning unit 57.

The plurality of arm members, the turning unit 57, and the chuck 55 are, for example, driven by drive systems provided therein with a certain rotation amount and in a certain rotation direction, with a certain turning amount and in a certain turning direction, or with a certain moving amount and in a certain moving direction. The controller 8 controls each operation of the support column 59, the plurality of arm members, the turning unit 57, and the chuck 55 independently.

As illustrated in FIGS. 6 and 7, the chuck 55 includes a locking portion 53, two claws 54, 54 provided at a distal end of the locking portion 53, and an receiving portion 56 recessed in the locking portion 53. When the locking portion 53 extends perpendicularly, the receiving portion 56 receives the substrate 4, and the two claws 54, 54 are spaced apart from each other in a width direction of the locking portion 53 to support an outer peripheral lower portion of the substrate 4. The receiving portion 56 is sized to have an outer diameter slightly larger than an outer diameter of the substrate 4. As a result, the substrate 4 can move in the receiving portion 56. When the outer peripheral lower portion of the substrate 4 is positioned at a disengagement position where the outer peripheral lower portion is not engaged with the two claws 54, 54, the substrate 4 can be disengaged from the receiving portion 56. When the outer peripheral portion of the substrate 4 is positioned at an engagement position where the outer peripheral portion is engaged with the two claws 54, 54, the substrate 4 is locked to the receiving portion 56. Therefore, the receiving portion 56 can disengageably receive the substrate 4 by adjusting positional relationship between the outer peripheral portion of the substrate 4 and the two claws 54, 54. Accordingly, the chuck 55 can disengageably chuck the substrate 4.

The controller 8 controls an operation of the chuck 55 to disengageably chuck the substrate 4. An operation of the articulated robot 9, that is, a combination of operations of the support column 59, the plurality of arm members, and the turning unit 57 can move the substrate 4 to the engagement position or the disengagement position in the receiving portion 56 of the chuck 55, so that the receiving portion 56 of the chuck 55 can disengageably receive the substrate 4.

In addition, as indicated by an arrow in FIG. 1, the articulated robot 9 is movable in a horizontal direction. As a result, the articulated robot 9 can move between the carriers 2, the swelling processing tank 10, the cleaning processing tanks 5, and the drying processing tanks 7 to convey the substrate 4.

A plurality of substrates 4 are placed in a horizontal posture on the carrier 2. The articulated robot 9 takes out one substrate 4 from the plurality of substrates 4 placed in a horizontal posture on the carrier 2. Then, the articulated robot 9 conveys the one substrate 4 taken out from the carrier 2 to the swelling processing tank 10, and places the one substrate 4 in a vertical posture on an empty holder 22. The placed one substrate 4 is held by the holder 22. The substrate up-and-down actuator 20 moves the one substrate 4 held in a vertical posture by the holder 22 downward from the non-immersed position to the immersed position in the swelling processing tank 10. By keeping the one substrate 4 at the immersed position for a predetermined time, swelling processing of the one substrate 4 is performed for a predetermined swelling processing time.

When the predetermined swelling processing time has elapsed, the substrate up-and-down actuator 20 moves the holder 22 on which the one substrate 4 is placed upward to the non-immersed position, and then the articulated robot 9 engages the one substrate 4 at the non-immersed position with the locking portion 53 to remove the one substrate 4 from the holder 22. Then, the articulated robot 9 places another substrate 4 different from the one substrate 4 on the holder 22 at the non-immersed position. In such a way, resist removal processing is individually performed for each substrate 4.

The articulated robot 9 conveys the substrate 4 subjected to the swelling processing from the swelling processing tank 10 to the cleaning processing tank 5. In the cleaning processing tank 5, cleaning processing (so-called "rinse processing") to remove residues remaining on a surface of the substrate 4 is performed for the substrate 4 which was subjected to the swelling processing. The cleaning processing tank 5 includes a two-fluid nozzle. From the two-fluid nozzle, a rinse fluid containing a pressurized gas (for example, nitrogen gas) and a cleaning liquid (for example, pure water) is sprayed onto the surface of the substrate 4. When the rinse fluid is sprayed onto the surface of the substrate 4, residues remaining on the surface of the substrate 4 are removed from the surface of the substrate 4. As a result, the substrate 4 is subjected to the cleaning processing. Note that a backup plate may be disposed on a back surface of the substrate 4, in particular, when the substrate 4 is thin. The back surface of the substrate 4 can also be cleaned using a substrate back surface center nozzle.

The articulated robot 9 conveys the substrate 4, which was subjected to the cleaning processing, from the cleaning processing tank 5 to the drying processing tank 7. In the drying processing tank 7, for example, so-called spin drying is performed to scatter the rinse fluid adhering to the substrate 4 using centrifugal force by rotating the substrate 4 at a high speed, thereby drying the substrate 4.

The articulated robot 9 conveys the substrate 4, which was subjected to drying processing, from the drying processing tank 7 to the carrier 2. In the carrier 2, the substrate 4 is placed in a horizontal posture, for example. By placing the substrate 4 on the carrier 2, a series of processing for the substrate 4 in the liquid chemical processing device 1 is completed. The controller 8 controls the operations of the liquid chemical processing device 1 so as to repeatedly perform the same operations for each of other substrates 4, including the resist removal processing for the plurality of substrates 4 one by one (that is, in a single wafer manner). Therefore, the swelling processing time of the substrates 4 can be individually set, so that it is possible to decrease a difference in the swelling processing time for each substrate 4. Accordingly, it is possible to suppress variation in photoresist removal for each substrate 4.

According to the liquid chemical processing device 1 of the first embodiment, the substrates 4 held by the holders 22 individually and vertically move between the immersed position and the non-immersed position, and are subjected to the resist removal processing in a single wafer manner. Accordingly, it is possible to suppress variation in resist removal for each substrate 4.

Second Embodiment

Figure 9:
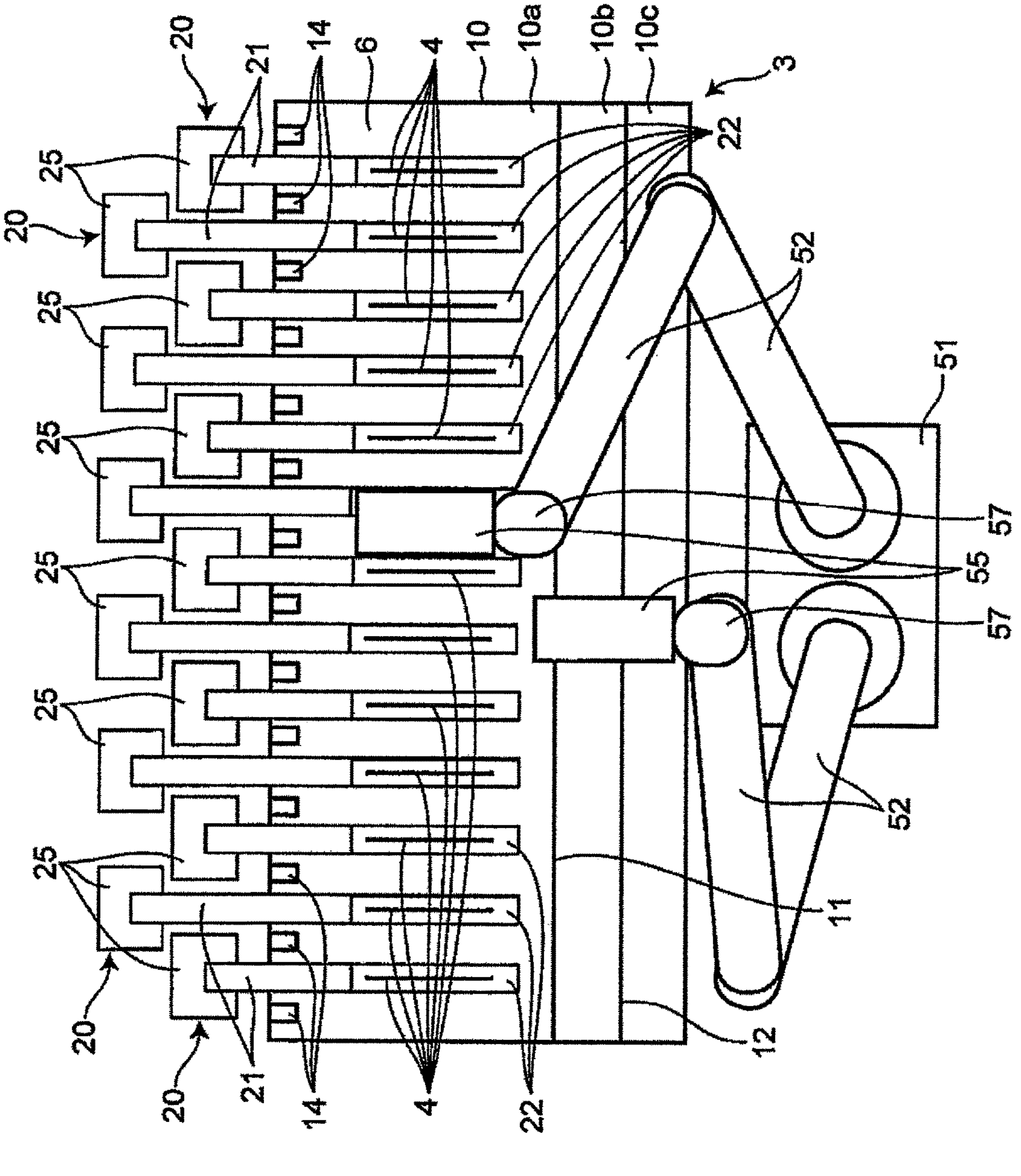
FIG. 9 is a plan view illustrating a swelling processing tank in a liquid chemical processing device according to a second embodiment.

The liquid chemical processing device 1 according to a second embodiment will be described with reference to FIG. 9. FIG. 9 is a plan view illustrating the swelling processing system 3 in the liquid chemical processing device 1 according to the second embodiment. Other than characteristic portions, configurations of the liquid chemical processing device 1 according to the second embodiment are the same as those of the liquid chemical processing device 1 according to the first embodiment. Accordingly, the characteristic portions of the liquid chemical processing device 1 according to the second embodiment will be mainly described.

As illustrated in FIG. 9, the substrate up-and-down actuators 20 are provided in a staggered arrangement with respect to the swelling processing tank 10 of the liquid chemical processing device 1. Although the vertical movement actuators 25 are provided in a staggered arrangement, the holders 22 are arranged in a row spaced apart from each other along the longitudinal direction (that is, lateral direction) of the processing tank 10*a* by adjusting horizontal lengths of the vertical movement arms 21. Therefore, the substrates 4 held by the holders 22 are also positioned in a row spaced apart from each other along the longitudinal direction (that is, lateral direction) of the processing tank 10*a*. The vertical movement actuators 25, which require space in the lateral direction, are alternately set back, and adjacent vertical movement arms 21 are disposed close to each other and adjacent holders 22 are disposed close to each other. Accordingly, intervals between adjacent substrates 4 can be shortened.

With such a configuration, it is possible to shorten the intervals between adjacent substrates 4, save the space for the swelling processing tank 10 (for example, saving about 20% as compared with the swelling processing tank 10 illustrated in FIG. 8), and reduce the stripping solution (that is, chemical) 6 used in the swelling processing tank 10.

Third Embodiment

Figure 10:
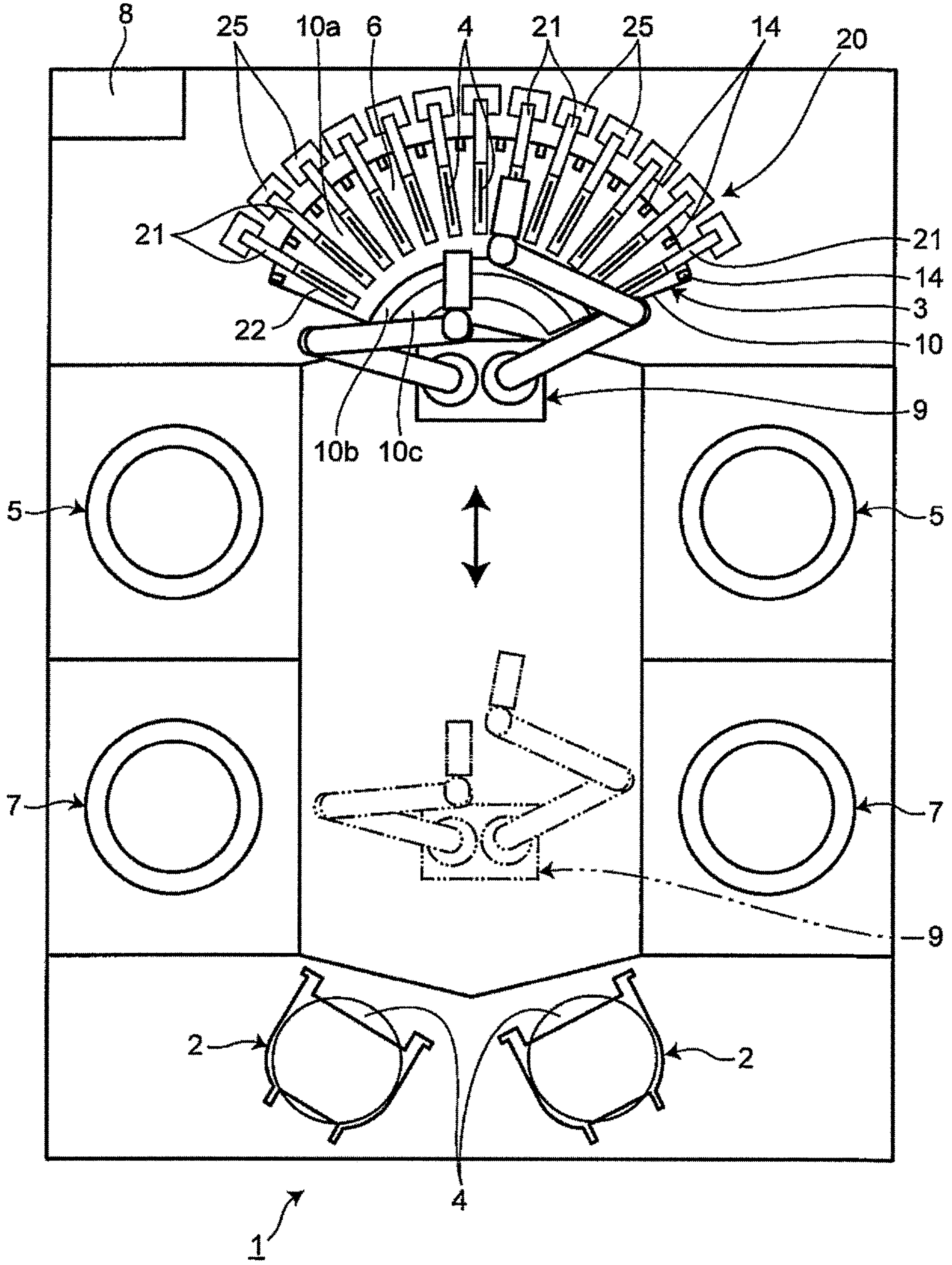
FIG. 10 is a plan view illustrating a liquid chemical processing device according to a third embodiment.
Figure 11:
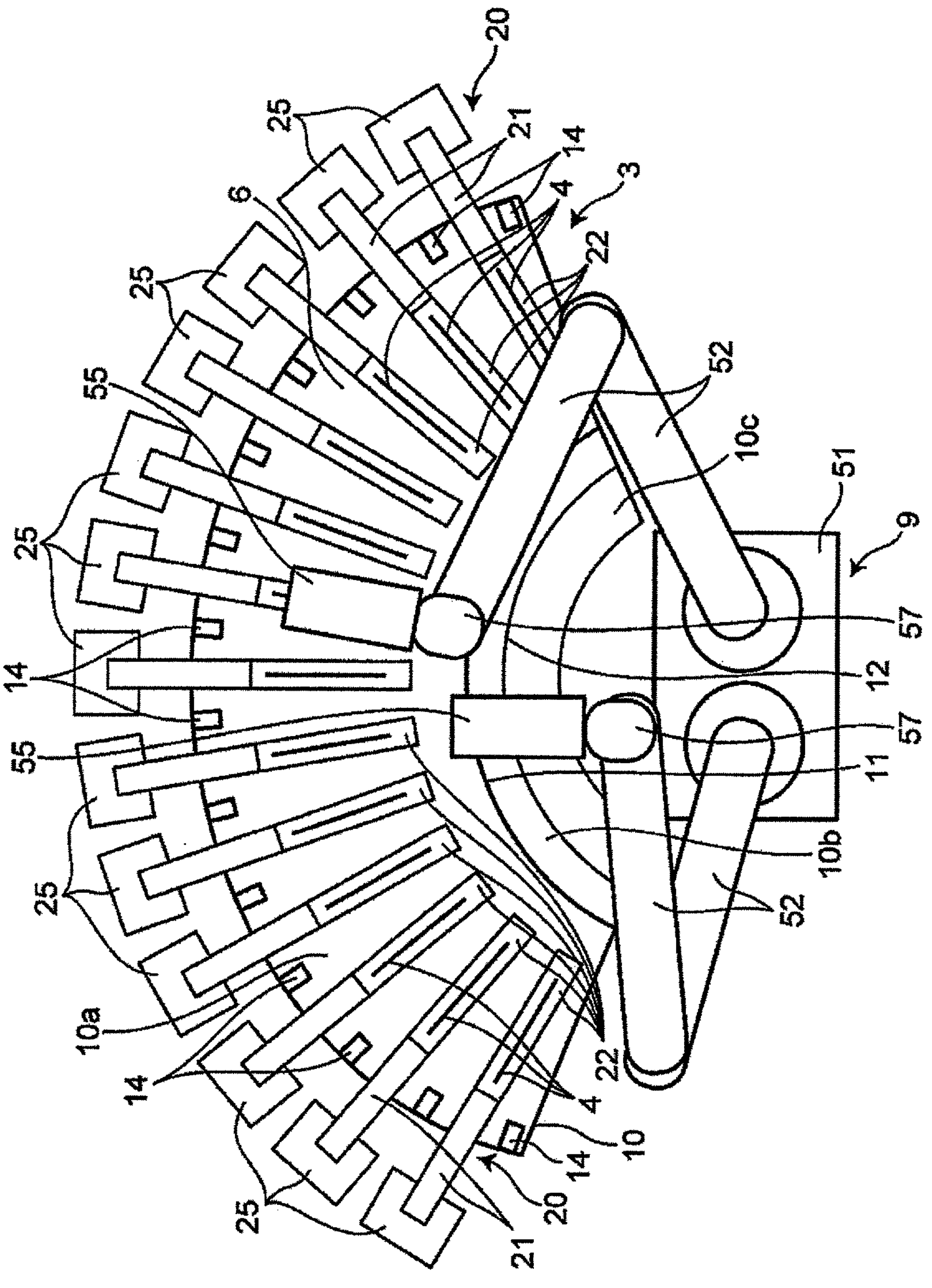
FIG. 11 is a plan view illustrating a swelling processing tank in the liquid chemical processing device illustrated in FIG. 10.

The liquid chemical processing device 1 according to a third embodiment will be described with reference to FIGS. 10 and 11. FIG. 10 is a plan view illustrating the liquid chemical processing device 1 according to the third embodiment. FIG. 11 is a plan view illustrating the swelling processing tank 10 in the liquid chemical processing device 1 illustrated in FIG. 10. Other than characteristic portions, configurations of the liquid chemical processing device 1 according to the third embodiment are the same as those of the liquid chemical processing device 1 according to the first embodiment. Accordingly, the characteristic portions of the liquid chemical processing device 1 according to the third embodiment will be mainly described.

As illustrated in FIGS. 10 and 11, the swelling processing tank 10 is fan-shaped in a plan view, and the articulated robot 9 is disposed at a center of the fan shape. The substrate up-and-down actuators 20 are provided along an outer arc of the swelling processing tank 10. The substrate up-and-down actuators 20, which require space in the lateral direction, are disposed on a side of the outer arc of the fan shape, so that adjacent vertical movement arms and adjacent holders 22 are disposed close to each other. Accordingly, intervals between adjacent substrates 4 can be descreased.

With such a configuration, it is possible to save the space for the swelling processing tank 10 (for example, saving about 44% as compared with the swelling processing tank 10 illustrated in FIG. 8), reduce the stripping solution (that is, chemical) 6 used in the swelling processing tank 10, and reduce a rotation radius of the articulated robot 9.

Fourth Embodiment

Figure 12:
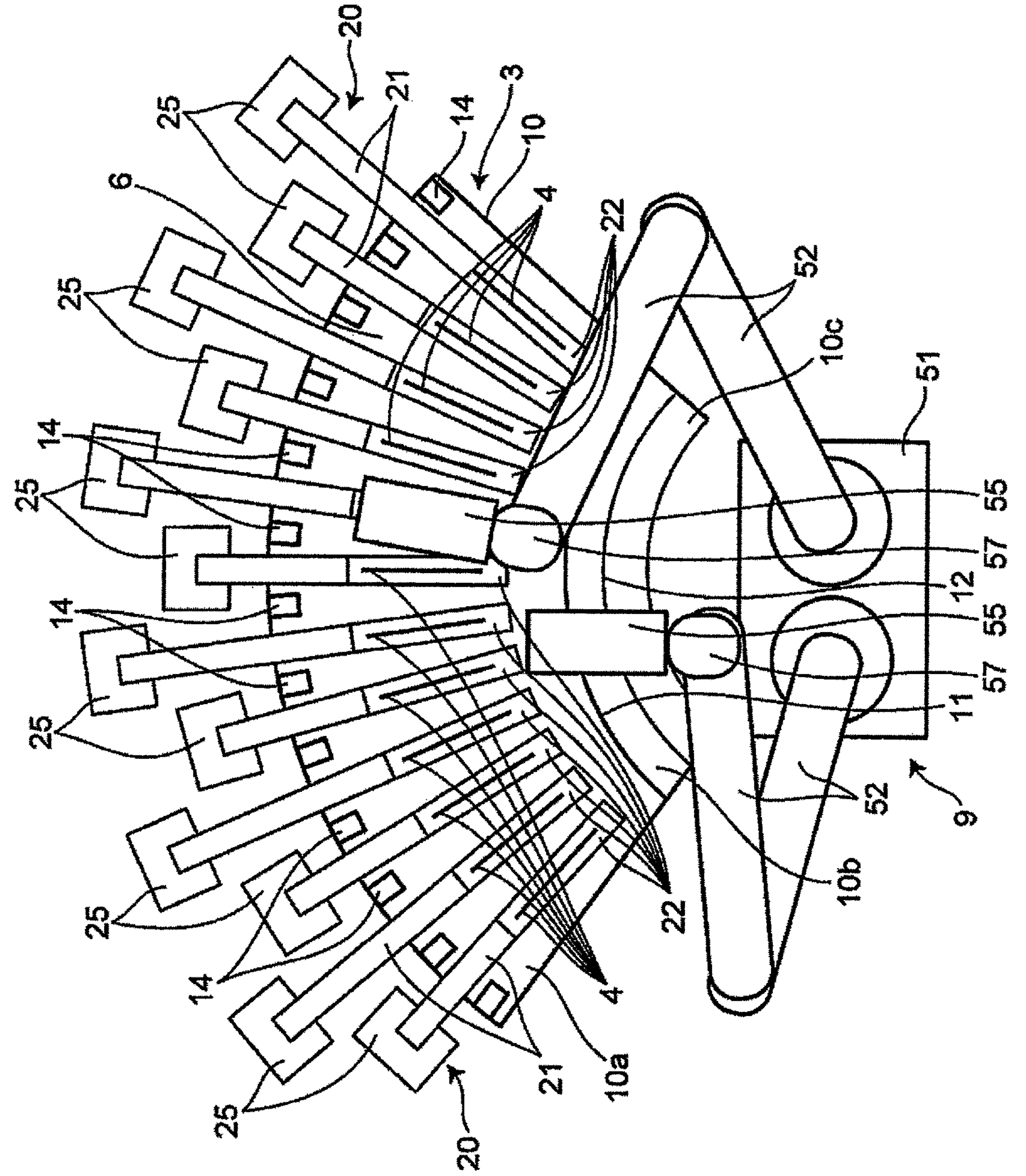
FIG. 12 is a plan view illustrating a swelling processing tank in a liquid chemical processing device according to a fourth embodiment.

The liquid chemical processing device 1 according to a fourth embodiment will be described with reference to FIG. 12. FIG. 12 is a plan view illustrating the swelling processing tank 10 in the liquid chemical processing device 1 according to the fourth embodiment. Other than characteristic portions, configurations of the liquid chemical processing device 1 according to the fourth embodiment are the same as those of the liquid chemical processing device 1 according to the third embodiment. Accordingly, the characteristic portions of the liquid chemical processing device 1 according to the fourth embodiment will be mainly described.

As illustrated in FIG. 12, the substrate up-and-down actuators 20 are provided in a staggered arrangement with respect to the swelling processing tank 10 having a fan shape in a plan view. Although the vertical movement actuators 25 are provided in a staggered arrangement, the holders 22 are arranged in a row spaced apart from each other along a circumferential direction of the processing tank 10*a* by adjusting horizontal lengths of the vertical movement arms 21. Therefore, the substrates 4 held by the holders 22 are positioned in a row spaced apart from each other along the circumferential direction of the processing tank 10*a*. The vertical movement actuators 25, which require space in the circumferential direction, are alternately set back, and adjacent vertical movement arms 21 are disposed close to each other and adjacent holders 22 are disposed close to each other. Accordingly, intervals between adjacent substrates 4 can be decreased.

With such a configuration, it is possible to shorten the intervals between adjacent substrates 4, save the space for the swelling processing tank 10, and reduce the stripping solution (that is, chemical) 6 used in the swelling processing tank 10.

Specific embodiments of the present invention have been described. However, the present invention is not limited to the above embodiments, and can be implemented with various modifications made within the scope of the present invention.

In the above embodiments, the substrates 4 are placed in a horizontal posture on the carriers 2. However, the substrates 4 may be placed in a vertical posture on the carriers 2.

In the above embodiments, the rinse fluid sprayed from the two-fluid nozzle in the cleaning processing tank 5 includes nitrogen as the pressurized gas and pure water as the cleaning liquid. However, an inert gas or the like may be used as the pressurized gas, and chemicals other than organic solvent may be used as the cleaning liquid.

In the above embodiments, the liquid chemical processing device 1 includes one swelling processing tank 10, two cleaning processing tanks 5, 5, and two drying processing tanks 7, 7. Not limited thereto, the number of tanks of the liquid chemical processing device 1 can be increased or decreased.

In the above embodiments, a conveyance device to convey the substrates 4 is the articulated robot 9. However, other various conveyance units can be used as the conveyance device.

In the above embodiments, the lift-off processing are performed for circuit patterns of metal films formed on the substrates 4. However, the liquid chemical processing device 1 according to the present invention can also be applied to resist removal processing for patterns of various films formed on various substrates 4 in manufacturing, for example, flat panel display (that is, FPD) substrates, surface acoustic wave (that is, SAW) devices, micro-electro mechanical systems (that is, MEMs), hard disks, or the like.

The present invention and embodiments are summarized as follows.

The liquid chemical processing device 1 according to one aspect of the present invention includes:

- the processing tank 10*a* in which resist removal processing is performed by immersing the substrates 4 in the chemical 6;
- the plurality of holders 22 configured to hold the substrates 4 in a vertical posture;
- the vertical drivers 20 configured to individually and vertically drive the holders 22; and
- the chuck 53 configured to disengageably chuck the substrates 4,
- wherein the vertical drivers 20 are configured to individually and vertically move the holders 22 between the immersed position where the substrates 4 are immersed in the chemical 6 and the non-immersed position where the substrates 4 are lifted up from the chemical 6, and the substrates 4 held by the holders 22 are subjected to the resist removal processing in a single wafer manner.

With such a configuration, the substrates 4 held by the holders 22 individually and vertically move between the immersed position and the non-immersed position, and are subjected to the resist removal processing in a single wafer manner. Accordingly, it is possible to suppress variation in resist removal for each substrate 4.

Further, in the liquid chemical processing device 1 according to one embodiment, the ultrasonic generator 17 is disposed at the bottom of the processing tank 10*a*.

According to the above embodiment, stripping of the coating material from the substrates 4 is promoted, and the coating material stripped off from the substrates 4 is pulverized, so that the sludge generated by the pulverization easily flows toward downstream.

Further, in the liquid chemical processing device 1 according to one embodiment, the nozzle 14 is disposed at the upper portion of the processing tank 10*a*, the nozzles 14 being configured to eject the chemical 6 downward toward the substrates 4.

According to the above embodiment, the stripped coating material is prevented from readhering to the substrates 4, so that the generated sludge is easily recovered.

Further, in the liquid chemical processing device 1 according to one embodiment, the processing tank 10*a* communicates with the storage tank 10*b* adjacent to the processing tank 10*a* through the communication port 15 provided in the bottom of the communication side-wall 11 of the processing tank 10*a*.

According to the above embodiment, the chemical 6 in the processing tank 10*a* flows into the storage tank 10*b* as downflow. Accordingly, it is possible to prevent the stripped coating material from readhering to the substrates 4.

Further, in the liquid chemical processing device 1 according to one embodiment, the discharge tank 10*c* is disposed adjacent to the storage tank 10*b* to store the chemical 6 that overflows from the storage tank 10*b*; and the circulation path 40 is provided between the nozzles 14 and the discharge tank 10*c* to allow the chemical 6 to circulate.

According to the above embodiment, the organic solvent and the metal contained in the used chemical 6 can be reused, so that the running costs of the liquid chemical processing device 1 can be reduced.

Further, in the liquid chemical processing device 1 according to one embodiment, the filtering systems 31, 48, and 49 in which the recovery target size of the sludge contained in the chemical 6 is reduced stepwise are provided in the circulation path 40.

According to the above embodiment, it is possible to reduce the replacement frequency of expensive filter elements, suppress downtime of the liquid chemical processing device 1, and increase the production efficiency.

Further, in the liquid chemical processing device 1 according to one embodiment, the stagnation prevention portion 16 is provided at the bottom of the storage tank 10*b* on the opposite side of the communication port 15.

According to the above embodiment, it is possible to prevent sludge from accumulating at the corner where the bottom of the storage tank 10*b* and the overflow side-wall 12 intersect with each other.

The liquid chemical processing device 1 according to one embodiment further includes the controller 8 configured to control each of the vertical drivers 20 and the chuck 55, wherein the controller 8 is configured to perform the resist removal processing individually for each of the substrates 4, the resist removal processing including:

placing one of the substrates 4 on the holder 22 at the non-immersed position;

moving the holder 22 holding the substrate 4 downward to the immersed position;

keeping the one substrate 4 at the immersed position for a predetermined time;

moving the holder 22 holding the substrate 4 upward to the non-immersed position;

chucking the substrate 4 at the non-immersed position by the chuck 55 and removing the substrate 4 from the holder 22; and placing another of the substrates 4 different from the substrate 4 on the holder 22 at the non-immersed position.

According to the above embodiment, the swelling processing time of the substrates 4 can be individually managed, so that it is possible to decrease a difference in the swelling processing time for each substrate 4. Accordingly, it is possible to suppress variation in resist removal for each substrate 4.

Further, in the liquid chemical processing device 1 according to one embodiment, the vertical drivers 20 are provided in a staggered arrangement with respect to the processing tank 10*a*.

According to the above embodiment, it is possible to shorten the intervals between adjacent substrates 4, save the space for the processing tank 10*a*, and reduce the chemical 6 used in the processing tank 10*a*.

Further, in the liquid chemical processing device 1 according to one embodiment, the processing tank 10*a* is fan-shaped in a plan view, and the vertical drivers 20 are provided along the outer arc of the processing tank 10*a*.

According to the above embodiment, it is possible to save the space for the processing tank 10*a* and reduce the chemical 6 used in the processing tank 10*a*.

REFERENCE NUMERALS

1 liquid chemical processing device
2 carrier
3 swelling processing system
4 substrate
5 cleaning processing tank
6 stripping solution (chemical)
7 drying processing tank
8 controller
9 articulated robot
10 swelling processing tank
10*a* processing tank
10*b* storage tank
10*c* discharge tank
11 communication side-wall
12 overflow side-wall
14 nozzle
15 communication port
16 stagnation prevention portion
17 ultrasonic generator
20 substrate up-and-down actuator (vertical driver)
21 vertical movement arm
22 holder
23 substrate receiver
25 vertical movement actuator
30 sludge recovery tank (sludge recovery unit)
31 mesh filter (filtering system)
32 coarse mesh basket
33 intermediate mesh basket
34 fine mesh basket
36 filter take-out portion
37 exhaust unit
40 circulation path
41 pipe
42 pipe
43 pipe
44 pipe
45 pipe
46 valve
47 circulation pump
48 liquid cyclone (filtering system)
49 chemical filter (filtering system)
51 base
52 articulated arm
53 locking portion
54 claw
55 chuck
56 receiving portion
57 turning unit
59 support column

The invention claimed is:

1. A liquid chemical processing device comprising:

a processing tank in which resist removal processing is performed by immersing substrates in a chemical;

a storage tank;

a discharge tank;

a plurality of holders configured to hold the substrates in a vertical posture;

vertical drivers configured to individually and vertically drive the plurality of holders; and a chuck configured to disengageably chuck the substrates, wherein the vertical drivers are configured to individually and vertically move the plurality of holders between an immersed position where the substrates are immersed in the chemical and a non-immersed position where the substrates are lifted up from the chemical, and the substrates held by the plurality of holders are subjected to the resist removal processing in a single wafer manner, wherein a nozzle is disposed at an upper portion of the processing tank, the nozzle being configured to eject the chemical downward toward the substrates, the processing tank communicates with the storage tank that is adjacent to and downstream of the processing tank through a communication port provided in a bottom of a communication side-wall of the processing tank, the storage tank being adjacent to and in communication with the discharge tank, and bottoms of the processing tank, the storage tank and the discharge tank being inclined downward in a downstream direction of flow of the chemical toward the discharge tank, and the communication port and the storage tank are not provided with a driver to move the substrates.

2. The liquid chemical processing device according to claim 1, wherein an ultrasonic generator is disposed at a bottom of the processing tank.

3. The liquid chemical processing device according to claim 1, wherein the communication port is provided in a bottommost part of the communication side-wall.

4. The liquid chemical processing device according to claim 1, wherein the discharge tank stores the chemical that overflows from an overflow side-wall that separates the storage tank and the discharge tank from each other, and wherein a height of the overflow side-wall is lower than a height of the communication side-wall.

5. The liquid chemical processing device according to claim 4, wherein a circulation path is provided between the nozzle and the discharge tank to allow the chemical to circulate.

6. The liquid chemical processing device according to claim 5, wherein a filtering system in which recovery target size of sludge contained in the chemical is reduced stepwise is provided in the circulation path.

7. The liquid chemical processing device according to claim 1, wherein a stagnation prevention portion is provided at a bottom of the storage tank on an opposite side of the communication port.

8. The liquid chemical processing device according to claim 1, further comprising a controller configured to control each of the vertical drivers and the chuck, wherein the controller is configured to perform the resist removal processing individually for each of the substrates, the resist removal processing including:

placing one of the substrates on one of the plurality of holders at the non-immersed position;

moving the one of the plurality of holders holding the one of the substrates downward to the immersed position;

keeping the one of the substrates at the immersed position for a predetermined time;

moving the one of the plurality of holders holding the one of the substrates upward to the non-immersed position;

chucking the one of the substrates at the non-immersed position by the chuck and removing the one of the substrates from the one of the plurality of holders; and placing another of the substrates different from the one of the substrates on the one of the plurality of holders at the non-immersed position.

9. The liquid chemical processing device according to claim 1, wherein the vertical drivers are provided in a staggered arrangement with respect to the processing tank.

10. The liquid chemical processing device according to claim 1, wherein the processing tank is fan-shaped in a plan view, and the vertical drivers are provided along an outer arc of the processing tank.

11. The liquid chemical processing device according to claim 1, wherein there is no overflow from the processing tank to the storage tank via an upper end of the communication side-wall.

12. The liquid chemical processing device according to claim 1, wherein the communication port is configured to permit continuous flow of processing liquid between the processing tank and the storage tank during operation.

13. The liquid chemical processing device according to claim 1, wherein the processing tank and the storage tank are directly adjacent to one another.

14. The liquid chemical processing device according to claim 1, wherein the storage tank and the discharge tank are directly adjacent to one another.

* * * * *